United States Patent [19]

Korteling

[11] Patent Number: 5,081,379
[45] Date of Patent: Jan. 14, 1992

[54] CURRENT-SENSING CIRCUIT FOR AN IC POWER SEMICONDUCTOR DEVICE

[75] Inventor: Aart G. Korteling, Eindhoven, Netherlands

[73] Assignee: U.S. Philips Corporation, New York, N.Y.

[21] Appl. No.: 233,969

[22] Filed: Aug. 18, 1988

Related U.S. Application Data

[63] Continuation of Ser. No. 935,895, Nov. 28, 1986, abandoned.

[30] Foreign Application Priority Data

Dec. 10, 1985 [NL] Netherlands .......................... 8503394

[51] Int. Cl.⁵ ............................................. H03K 17/12
[52] U.S. Cl. ..................... 307/530; 307/270; 307/355; 307/350; 307/570
[58] Field of Search .............. 307/530, 355, 270, 350, 307/570; 330/288, 253, 261

[56] References Cited

U.S. PATENT DOCUMENTS

| | | | |
|---|---|---|---|
| 4,064,506 | 12/1977 | Cartwright, Jr. | 330/288 |
| 4,427,903 | 1/1984 | Sugimoto | 307/355 |
| 4,477,782 | 10/1984 | Swanson | 330/288 |
| 4,573,021 | 2/1986 | Widlar | 330/288 |
| 4,675,561 | 6/1987 | Bowers | 307/304 |

Primary Examiner—Timothy P. Callahan
Attorney, Agent, or Firm—Bernard Franzblau

[57] ABSTRACT

A circuit for measuring the current through a power transistor comprising at least two groups of parallel-switched transistors. A first large group of transistors carries the power current and a second group of transistors carries a current to be measured which is proportional to the power current when the base-emitter voltage or the gate-source voltage (in the case of bipolar or field effect transistors) of all the transistors in the groups is the same. The voltage difference between the parallel-switched emitters or sources of the two groups is measured by means of a differential amplifier and the emitter or source voltage of the first group is impressed on the emitters or sources of the second group by means of a control transistor driven by the differential amplifier. Except in extreme cases (for example, a short-circuit) the current to be measured through the second group follows the power current through the first group on a proportional basis.

24 Claims, 1 Drawing Sheet

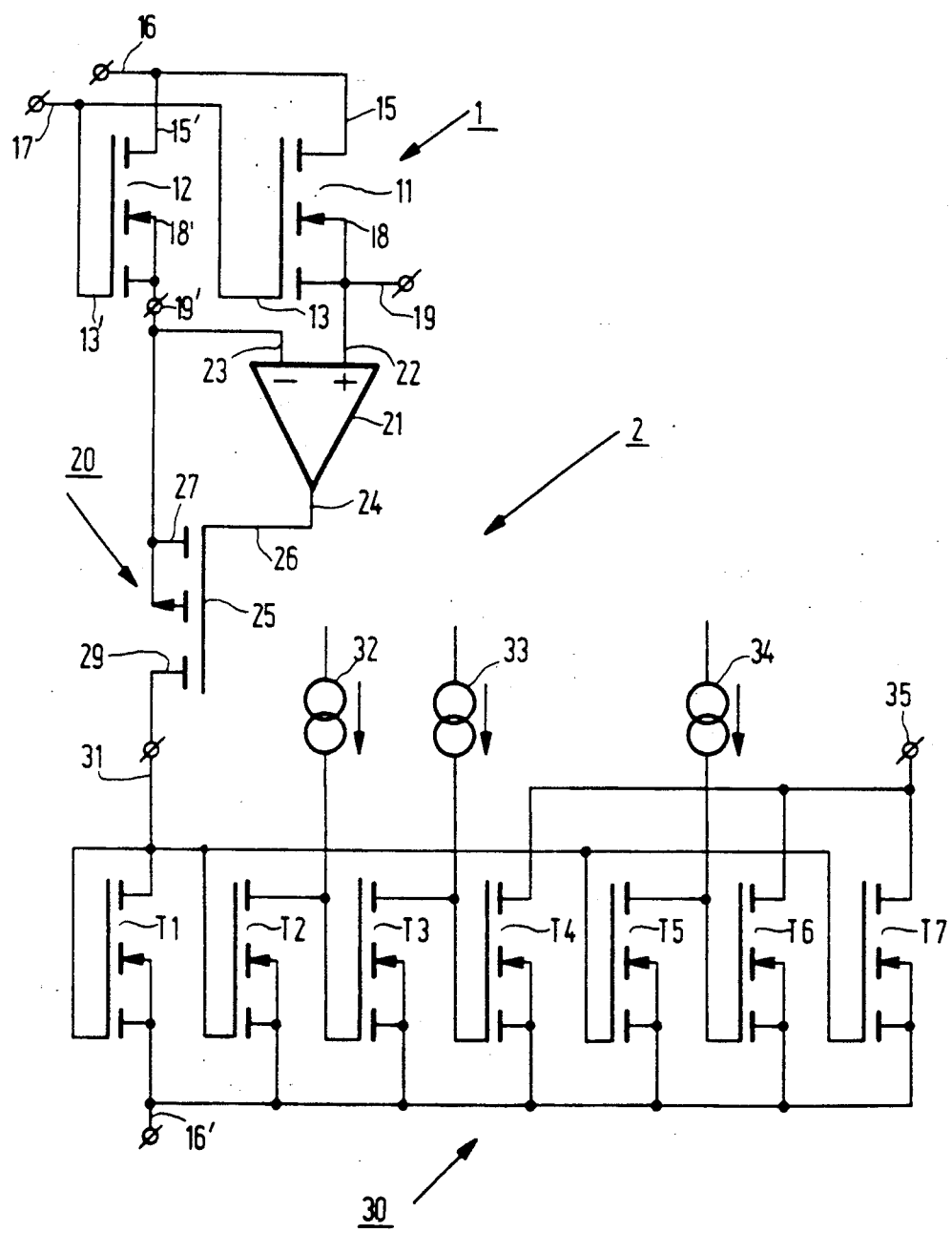

CURRENT-SENSING CIRCUIT FOR AN IC POWER SEMICONDUCTOR DEVICE

This is a continuation of application Ser. No. 935,895, filed Nov. 28, 1986, now abandoned.

BACKGROUND OF THE INVENTION

This invention relates to a current-sensing circuit for sensing an output current of a power semiconductor arrangement, which comprises a semiconductor body having a first and a second current-carrying section, each section containing at least one basic semiconductor element. The first current-carrying section is arranged to carry a significantly higher current than the second current-carrying section and the first and second current-carrying sections have a common anode and a separate first and second cathode, respectively.

A current-sensing circuit of the kind indicated above, and more especially the power semiconductor arrangement described in the preamble, are known from EP-A-O 139 998 which corresponds to U.S. Pat. No. 4,783,690 filed on Nov. 8, 1988.

In a practical embodiment the known power semiconductor arrangement contains a first current-carrying section with a large number of basic semiconductor elements, such as diodes, bipolar and/or field effect transistors and thyristors. The second current-carrying section has a significantly smaller number of such basic semiconductor elements or only one such basic semiconductor element. It is also possible for both the first and second current-carrying sections to contain only one basic semiconductor element, each of which however then has a different construction and/or geometry.

In a few power semiconductor arrangements provision may also be made for several second current-carrying sections.

In addition, control electrodes of the first and second current-carrying section may be connected to each other, either in the semiconductor body or externally.

In this known power semiconductor arrangement the current level in the second current-carrying section may be said to be proportional to the current level in the first current-carrying section, as a result of which the current level in the first current-carrying section can be sensed by an external low power circuit because only a fraction of the output current of the power semiconductor arrangement, i.e. the output current of the second current-carrying section, need be sensed in order to be able to determine the current level in the first current-carrying section.

It has been found, however, that under certain circumstances, for example a change in the input impedance of the current-sensing circuit and/or of the load connected to the semiconductor power arrangement, the output current of the semiconductor power arrangement at the first cathode and the measuring current at the second cathode are certainly not proportional to each other.

SUMMARY OF THE INVENTION

An object of the invention is to provide a current-sensing circuit which is reliable by virtue of the fact that under normal circumstances the measuring current is proportional to the output current of the power semiconductor arrangement.

For this purpose, the invention provides an arrangement of the kind mentioned in the preamble, characterised in that the current-sensing circuit comprises a voltage impression device connected to the first cathode which impresses the voltage of the first cathode on the second cathode.

Thanks to the proposed voltage impression device, during the operation of the power semiconductor arrangement the voltage on the second cathode, except in extreme circumstances to be described later, will be equal to that on the first cathode so that, supposing for the sake of convenience for a moment that both in the first and the second current-carrying section of the power semiconductor arrangement the same basic elements are used, that is with the same construction and geometry, then, each such basic semiconductor element, whether it is a part of the first or second current-carrying section, will carry the same subcurrent, assuming here that the second current-carrying section contains several basic semiconductor elements.

In this case, when there are n basic semiconductor elements in the first current-carrying section and m in the second, the ratio of the measuring current mentioned—i.e. that at the second cathode—to the output current of the power semiconductor arrangement—i.e. that at the first cathode—will be m:n under any conductive conditions whatsoever.

As a result of the above-mentioned guaranteed ratio between the measuring current and the output current of the power semiconductor arrangement, it is possible to monitor the output current of the power semiconductor arrangement accurately and reliably, that is to follow the output current and/or to intervene in the operation of the power semiconductor arrangement when, in extreme circumstances, its output current falls below a minimum value or exceeds a maximum value and/or to provide an indication thereof.

If the proposal in question is applied, preferably in a smart integrated power semiconductor switch in motor vehicles, then when the output current of a power semiconductor switch, to which a load such as a lamp is connected, falls below a minimum value, it can mean that this lamp is defective. Conversely, exceeding a maximum value can mean that a short circuit has occurred.

BRIEF DESCRIPTION OF THE DRAWING

An embodiment of the invention will now be explained with reference to basis of the drawing, in which respect the single FIGURE of the drawing shows a clever power semiconductor switch including a power semiconductor arrangement and current-sensing circuit according to the invention, which can be integrated as a whole in a single semiconductor body and be incorporated in a single housing.

DESCRIPTION OF THE PREFERRED EMBODIMENT

In the figure the power semiconductor arrangement or switch is indicated by the reference FIG. 1, while the current-sensing circuit is indicated by the reference numeral 2. The combination circuit of the power semiconductor arrangement 1 and current-sensing circuit 2 can form part of a smart power semiconductor switch which is further equipped with, for example, a temperature sensor and a cutoff circuit. The present invention thus comprises both a current-sensing circuit and a smart power semiconductor switch. In the first case the current-sensing switch can be implemented with discrete components, but preferably it is integrated in the clever power semiconductor switch.

In the embodiment shown in the figure, the power semiconductor arrangement 1 is built up of n-channel MOSFETs 11 and 12, with a control electrode 13 and 13'. As already mentioned, a MOSFET is one possible basic semiconductor element, but other elements can also be used such as bipolar transistors, whether or not in combination with other transistors (for example BIMOS circuits), or thyristors or diodes. In the case of the last-mentioned basic semiconductor elements it is not entirely correct to speak of a power semiconductor switch because these basic semiconductor elements lack a control electrode. As regards the terms anode, cathode and control electrode the same convention is used as in the publication EP-A-O 139 998 already mentioned.

The MOSFET 11 shown in the figure stands for a number n, or at least in switching terms, parallel-switched MOSFETs, while the MOSFET 12 shown represents a number m, or at least in switching terms, parallel-switched MOSFETs. An essential point, however, is that the MOSFET 11 can conduct a substantially higher current than the MOSFET 12, which in principle could also be achieved by choosing different geometries for the MOSFETs 11 and 12, possibly using only one MOSFET each time, or by opting for a different construction of the basic semiconductor elements in the first current-carrying section, represented by the MOSFET 11, and in the second current-carrying section, represented by the MOSFET 12.

The fact that the first and second current-carrying sections 11 and 12 of the power semiconductor arrangement 1 have a common anode 16 is indicated in the figure by showing the anodes 15 and 15' of the MOSFETs 11 and 12 connected to this common anode 16. The common anode 16 is connected to a supply voltage, in this case, i.e. for an application in motor vehicles, the plus pole of a battery. In order to control the first current-carrying section 11 and the second current-carrying section 12 in the same way, the control electrodes 13 and 13' of the MOSFETs 11 and 12 are shown connected to a common control electrode 17. The connection of the control electrodes 13 and 13' of the MOSFETs 11 and 12 to the common control electrode 17 is not necessary, however, because, for example, the control electrode 13' of the MOSFET 12 need only be connected to the common control electrode 17 when the measuring current to be discussed here in further detail is being sensed, while provision could also be made for driving the MOSFET 12 separately.

The cathode 18 of the MOSFET 11 is connected to the power output 19 of the power semiconductor arrangement 1, while the cathode 18' of the MOSFET 12 is connected to a measuring output 19', which constitutes an external connection when the current-sensing circuit 2 to be described later is not integrated with the power semiconductor arrangement 1.

Between the power output 19 and the second supply voltage connection 16', in this case ground, a load is incorporated which is not shown.

The power output 19 is connected to the first cathode 18 of the first current-carrying section 11, while the measuring output 19' is connected to the second cathode 18' of the second current-carrying section 12.

Since the common anode 16 of the first and second current-carrying sections 11 and 12 is connected to the plus pole of the battery, a charge which, for example, is about 6 volts higher than the battery voltage must be pumped into the common control electrode 17 of the first and second current-carrying sections 11 and 12.

The current-sensing circuit 2 according to the invention is provided with a voltage impression device 20 and a level detection device 30. The voltage impression device 20 will be discussed first.

The purpose of the voltage impression device 20 is to give the measuring output 19', that is the second cathode 18' of the second current-carrying section 12, the voltage of the power output 19, in other words that of the first cathode 18 of the first current-carrying section 11. The implementation of the voltage impression device 20 shown in the figure comprises a feedback circuit with a differential amplifier 21 known in itself, which can be implemented with MOSFETs, and a control transistor 25, in this case a p-channel MOSFET with substrate control electrode, both of which can be integrated in the semiconductor body of the power semiconductor circuit. The control transistor 25 can, however, also be a bipolar transistor. A first input 22, the non-inverting input, of the differential amplifier 21 is connected to the power output 19, or the first cathode 18, while the second input 23, the inverting input, is connected to the measuring output 19', or the second cathode 18'. The output 24 of the differential amplifier 21 is connected to the control electrode 26 of the p-channel MOSFET 25 and the cathode 27 of the p-channel MOSFET 25 is connected to both the inverting input 23 of the differential amplifier 21 and the first cathode 18' of the n-channel MOSFET 12. The anode 29 of the MOSFET 25 is connected to the input 31 of the level detection device 30.

As already mentioned, the feedback circuit 21 and 25 keeps the voltage on the cathode 18' of the MOSFET 12 equal to that on the cathode 18 of the MOSFET 11, so that the channel resistance of each MOSFET element in the MOSFET 11 is equal to that of each MOSFET element in the MOSFET 12. Therefore, all of the MOSFET elements in both MOSFET 11 and MOSFET 12 will carry the same current and therefore the measuring current at the anode 29 of the control transistor 25 will be in the same ratio to the output current at the power output 19 as the number of MOSFET elements in MOSFET 12 is to the number of MOSFET elements in the MOSFET 11. This applies to all of the static and dynamic conductive conditions of the MOSFETs 11 and 12, which means that the measuring current, except in extreme cases to be further explained in detail, is unambiguously related to the output current of the power semiconductor arrangement 1.

The level detection device 30 will now be discussed.

The measuring current just mentioned is supplied to the input terminal 31 of the level detection device 30, which is provided with a current mirror formed by n-channel MOSFETs T1 and T7. Transistor T1 is connected as a diode because its control electrode is connected to its anode electrode, which is connected to the input of the level detection device and to the control electrode of transistor T7, the anode of which is connected to the output 35 of the current level detection device 30. In this case the cathodes of the transistors T1 and T7 are connected to ground 16'. As a result of the connection of the current mirror T1, T7 between the input 31 and the output 35 of the level detection device 30, the current at output 35 follows the measuring current at input 31. So that a low operating voltage can be used. The last-mentioned currents will be equal when the geometry of transistor T7 is equal to that of transistor T1. Thanks to the current mirror T1, T7 it is possible to measure critical current levels. This means that by following the measuring current a threshold related to a critical current level can be determined before extreme circumstances, as such occur. In the embodiment shown in the figure provision is made for a second current mirror T1, T5 which makes use of the same transistor T1 connected as a diode, while provision is also made for an n-channel MOSFET T5 switched analogously to transistor T7. The anode of transistor T5, however, unlike that of transistor T7, is not directly connected to the output 35 of the level detection device 30, but via, an n-channel MOSFET or detection transistor T6 connected in cascade. The junction between the anode of transistor T5 and the control electrode of transistor T6 is connected to a reference current source 34, the current value of which corresponds to an upper threshold level which is related to the maximum permissible output current at power output 19. When this output current is too high this can indicate a short circuit of the load connected to the power output 19. Transistor T6 is called a detection transistor because, when the measuring current at input 31 of the level detection device 30 is greater than the current supplied by the reference current source 34, this detection transistor T6 will become conductive. As a result a current flows at the output 35 of the current level detection device 30, which is partly determined by the detection transistor T6. In practice this can, for example, be 10 mA. The level of the current supplied by the reference current source 34 can, for example, be set to twice the nominal load current, in which respect the nominal load current can be determined, for example, half way along the path of the current normally to be conducted by transistor T7.

In the above it has been assumed that the geometry of transistor T1 and of transistor T5, with the same construction, is the same.

The cascade connection of the n-channel MOSFETs T1, T2 and T3 is analogous to that of the transistors T1, T5 and T6, in which respect, however, provision is made for a reference current source 32 which supplies a current with a value that determines a bottom threshold level which is related to the minimum desirable load current. In other words, a current level below this value is regarded as characteristic of an interruption in the circuit between the power output 19 and ground 16', for example, in the load.

The above therefore means that detection transistor T3 will become conductive when the measuring current at the input 31 of the current level detection device 30 is greater than the value of the current supplied by the reference current source 32. The detection transistors T3 and T6 therefore detect extreme circumstances.

Now, however, in order to indicate a drop below the bottom threshold level in a way which is the same as or equivalent to that of exceeding the upper threshold level, an inverter stage has been provided which in the embodiment shown consists of an auxiliary current source 33 and an n-channel MOSFET or inverter transistor T4.

When detection transistor T3 is conductive, inverter transistor T4 is blocked and vice versa. The current level of the reference current source 32 can, for example, be set to 0.05 times the measuring current. In this case T4 can also be dimensioned in such a way that in the conductive state it conducts a current of 10 milliamperes, as a result of which a current level of 10 milliamperes at the output 35 of the current level detection device 30 means that something is wrong with the load, in the case of a lamp, for example, a defective lamp or a short circuit: that means an extreme condition, which can lead to the power semiconductor arrangement 1 cutting out or provide an indication that a load has failed.

In addition, transistor T7 can then be dimensioned in such a way that at the maximum permissible output current of the power semiconductor arrangement 1 the current to be conducted by transistor T7 is lower than 10 milliamperes.

The implementation of the level detection device 30 is naturally not restricted to that shown in the figure and, in addition, other numerical values can be assumed. The various current mirrors can also be fitted each time with a separate transistor connected as a diode. Depending on the applications, it is also possible to provide a smaller or larger number of current mirrors than are shown in the example of the embodiment in the figure.

The current at the output 35 of the level detection device 30 can either be measured directly or as a voltage across a resistor connected to it.

What is claimed is:

1. A current-sensing circuit for sensing an output current of a power semiconductor arrangement of the type having a semiconductor body including a first and a second current-carrying section each containing at least one basic semiconductor element, wherein the first current-carrying section is arranged to carry a significantly higher current than the second current-carrying section and the first and second current-carrying sections have a common anode, respective control electrodes interconnected to a signal input terminal, and a separate first and second cathode, respectively, a voltage impression device connected to the first cathode which impresses a voltage of the first cathode on the second cathode, and an output terminal of the circuit coupled to said first cathode.

2. A current-sensing circuit as claimed in claim 1, characterised in that the voltage impression device comprises a differential amplifier having a first and second input connected to the first and second cathode, respectively, and a control transistor having a control electrode and a cathode connected, respectively, to an output and to the second input of the differential amplifier.

3. A current-sensing circuit in accordance with claim 2, including current level detection device having an input connected to an anode of the control transistor and an output which follows the current level at its input and/or if the current level at its input exceeds or falls below at least one threshold level generates at its output a respective current level with a certain fixed value.

4. A current-sensing circuit in accordance with claim 3, characterised in that the current level detection device comprises at least one current mirror connected between its input and output.

5. A current-sensing circuit in accordance with claim 4, characterised in that an output of said one current mirror is connected directly to the output of the current level detection device.

6. A current-sensing circuit in accordance with claim 4, characterised in that an output of the one current mirror is connected to a reference current source and is further connected to the output of the current level detection device via a detection transistor.

7. A current-sensing circuit in accordance with claim 6, wherein the detection transistor is connected directly to the output of the current level detection device and wherein a current provided by the reference current source determines a maximum threshold level which is related to a maximum permissible output current of the power semiconductor arrangement.

8. A current-sensing circuit in accordance with claim 6, characterised in that the detection transistor is connected via an inverter stage to the output of the current level detection device and wherein a current provided by the reference current source determines a minimum threshold level which is related to a minimally desired output current of the power semiconductor arrangement.

9. A current-sensing circuit in accordance with claim 8, characterised in that the inverter stage comprises an auxiliary current source and an inverter transistor having a control electrode connected to the auxiliary current source and to an anode of the detection transistor.

10. A current-sensing circuit in accordance with claim 9, characterised in that the detection transistor, or inverter transistor, are dimensioned so that current through the detection transistor and/or inverter transistor, is greater than the current at the output of the current level detection device at a maximum permissible output current of the power semiconductor arrangement.

11. A current-sensing circuit in accordance with claim 10, characterised in that the detection transistor, or the inverter transistor, is dimensioned so that the current through the detection transistor and the inverter transistor is the same.

12. A current-sensing circuit as claimed in claim 5 wherein said current level detection device comprises at least one further current mirror having an output connected to a reference current source and to the output of the current level detection device via a detection transistor, an input of the further current mirror being connected to the input of the current level detection device.

13. A current-sensing circuit as claimed in claim 1 further comprising a current level detection device having an input coupled to said second cathode and an output which follows the current level at its input within a given range of input currents.

14. A current-sensing circuit in accordance with claim 13, wherein the current level detection device comprises, first and second current mirrors which have a common transistor connected as a diode and coupled to the input of the current level detection device, and wherein an output of at least one of said current mirrors is coupled to the output of the current level detection device.

15. A current-sensing circuit as claimed in claim 14 wherein an output of at least one of said first and second current mirrors is connected directly to the output of the current level detection device.

16. A current-sensing circuit as claimed in claim 14 wherein an output of said at least one of said first and second current mirrors is connected to a reference current source and is further connected to the output of the current level detection device via a detection transistor.

17. A current-sensing circuit as claimed in claim 2, wherein said common anode is connected to one terminal of a source of DC supply voltage and said control transistor is connected in series circuit with said at least one basic semiconductor element of the second current-carrying section between said one terminal of the DC supply voltage and a second terminal thereof whereby a current in said control transistor is equal to the current in said second current-carrying section, said current in the control transistor being proportional to but less than the current in said first current-carrying section throughout normal operation of the power semiconductor arrangement.

18. A current-sensing circuit as claimed in claim 1 wherein said first current-carrying section comprises at least a first MOSFET device with its cathode directly connected to its substrate and said second current-carrying section comprises at least a second MOSFET device with its cathode directly connected to its substrate, and wherein the cathode of each MOSFET device is separate from and not in electrical connection with the substrate of the other one of the MOSFET devices.

19. A current-sensing circuit as claimed in claim 1 wherein said voltage impression device maintains the voltage levels of the first and second cathodes equal during normal operation of the power semiconductor arrangement whereby the current in the second current-carrying section is maintained at a given ratio to the current in the first current-carrying section throughout a desired range of load currents supplied to said output terminal.

20. A circuit for indicating an output current of a power semiconductor device that includes a body of semiconductor material having first and second sections wherein the first section includes at least one transistor and the second section includes at least one further transistor, said sections being arranged so that the at least one transistor of the first section carries a substantially higher level of current than the at least one further transistor of the second section, first and second terminals for connection to a source of supply voltage for the power semiconductor device, means coupling a first main electrode of sad one and said one further transistors of said first and second sections to the first supply terminal, a signal control input terminal coupled to control electrodes of the at least one transistor and the one further transistor, a voltage coupling device including a control transistor connected in series with said one further transistor of the second section between said first and second supply terminals, said voltage coupling device further comprising means having an input coupled to second main electrodes of the transistors of said first and second sections and an output coupled to a control electrode of the control transistor for maintaining drive voltages between control elctrodes and second main electrodes of the transistors of the first and second sections equal to one another whereby a current in the control transistor is proportional to a current in said at least one transistor of the first section, and an output terminal of the circuit connected to the second main electrode of the one transistor of the first section.

21. A circuit as claimed in claim 20 wherein the first section comprises n transistors and the second section comprises m transistors, where n>m, and said voltage coupling device controls the transistors of the first and second sections so that output currents at the second main electrodes of the transistors in said first and second sections, respectively, are in the ratio n:m for all values of signals expected at the control input terminal.

22. A circuit as claimed in claim 20 wherein said voltage coupling device includes a differential amplifier having first and second input terminals that comprise said input coupled to the second main electrodes of the transistors of said first and second sections and an output that comprises said output coupled to the control electrode of the control transistor.

23. A circuit as claimed in claim 20 further comprising a current level detection circuit having an input connected to an output terminal of the control transistor and an output which provides a current that follows the current at its input and is thus proportional to current in the at least one transistor of the first section.

24. A current-sensing circuit for sensing an output current of a power semiconductor arrangement of the type having a semiconductor body including a first and second current-carrying section each containing at least one basic semiconductor element, wherein the first current-carrying section is arranged to carry a significantly higher current than the second current carrying section and the first and second current-carrying sections have a common anode coupled to one terminal of a DC supply voltage, interconnected control electrodes coupled to a signal input terminal, and separate first and second cathodes, and a feedback circuit coupled to the first and second cathodes, said feedback circuit including a control transistor for maintaining a voltage on the second cathode equal to a voltage on the first cathode and further connected so that current flowing in the control transistor is equal to a current in the second current-carrying section with each said current being proportional to but significantly less than current in the first current-carrying section, and a current sensing terminal coupled to a main electrode of the control transistor.

* * * * *